Figure 1:
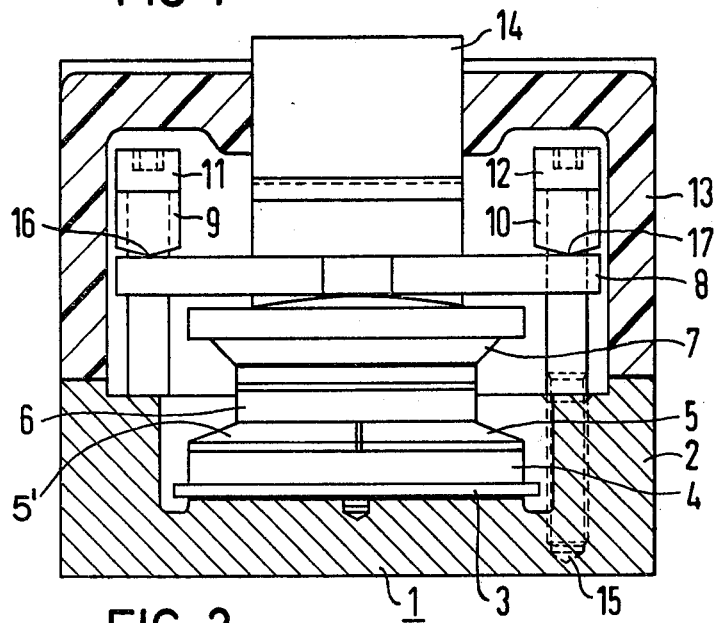

United States Patent [19]

Bahlinger

[11] 4,381,518

[45] Apr. 26, 1983

[54] SEMICONDUCTOR COMPONENT WITH SEVERAL SEMICONDUCTOR ELEMENTS

[75] Inventor: Walter Bahlinger, Munich, Fed. Rep. of Germany

[73] Assignee: Siemens Aktiengesellschaft, Berlin and Munich, Fed. Rep. of Germany

[21] Appl. No.: 188,455

[22] Filed: Sep. 18, 1980

[30] Foreign Application Priority Data

Oct. 19, 1979 [DE] Fed. Rep. of Germany ....... 2942401

[51] Int. Cl.³ ...................... H01L 23/42; H01L 23/02
[52] U.S. Cl. .......................................... 357/79; 357/81
[58] Field of Search ..................................... 357/79, 81

[56] References Cited

U.S. PATENT DOCUMENTS

| | | | |
|---|---|---|---|
| 2,728,881 | 3/1950 | Jacobi | 357/79 |
| 3,418,543 | 12/1968 | Marino et al. | 357/79 |
| 3,740,618 | 6/1973 | Vogel | 357/81 |
| 3,755,719 | 8/1973 | Wilcox | 357/79 |
| 3,982,308 | 9/1976 | Yoneda | 357/79 |
| 4,069,497 | 1/1978 | Steidlitz | 357/81 |
| 4,159,483 | 6/1979 | Bettin | 357/79 |
| 4,263,607 | 4/1981 | Legrand et al. | 357/79 |

FOREIGN PATENT DOCUMENTS 2604070 9/1976 Fed. Rep. of Germany .

Primary Examiner—Andrew J. James
Assistant Examiner—E. D. Burnside
Attorney, Agent, or Firm—Herbert L. Lerner; Laurence A. Greenberg

[57] ABSTRACT

Semiconductor component with a plurality of semiconductor elements disposed in a case having a metallic bottom being in heat-conducting contact with the semiconductor elements, electrical leads, and a leaf spring having ends and providing electrical pressure contact between the semiconductor elements and the leads, including yokes each holding a respective end of the spring, and at least two screws anchoring the yokes and the semiconductor elements to the bottom.

5 Claims, 2 Drawing Figures

SEMICONDUCTOR COMPONENT WITH SEVERAL SEMICONDUCTOR ELEMENTS

The invention relates to a semiconductor component with several semiconductor elements which are disposed in a case having a metallic bottom, are each provided with electrical pressure contact with leads by means of a leaf spring, are anchored in the bottom by means of screws, and are in heat-conducting contact with the bottom.

Such a semiconductor component has already been described heretofore. In that device the screws go through openings provided at the ends of the leaf spring. This, of necessity, results in springs having a length which is large relative to the width. The lever arm thereby also becomes large. In addition, the two screws must each take up one-half of the contact pressure. This necessitates a large screw diameter, so that the center line of the screw comes to lie relatively far away from the center of the disc. Together, these factors result in a relatively large bending moment which acts on the bottom of the semiconductor component, deforms the bottom and degrades the heat removal through the bottom to a heat sink.

Since in such a semiconductor component the heat is removed almost exclusively through the bottom, the latter must be as thin as possible. The bending section modulus of the bottom thereby becomes relatively small so that the bottom is heavily deformed under the high contact pressures. In addition, the spring pressure cannot be accurately set, since it can be determined only by the tightening torque of the screws and therefore depends on the friction coefficient of the spring, screws and bottom.

It is accordingly an object of the invention to provide a semiconductor component with several semiconductor elements which overcomes the hereinabove-mentioned disadvantages of the heretofore-known devices of this general type, and to do so in such a manner that the bottom is deformed less for the same spring force. This spring force should, in addition, be exactly settable.

With the foregoing and other objects in view there is provided, in accordance with the invention, a semiconductor component with a plurality of semiconductor elements disposed in a case having a metallic bottom being in heat-conducting contact with the semiconductor elements, electrical leads, and a leaf spring having ends and providing electrical pressure contact between the semiconductor elements and the leads, comprising a yoke holding each end of the spring, and at least two screws anchoring the yokes and the semiconductor elements to the bottom.

In accordance with another feature of the invention, each of the yokes have a knife edge formed thereon resting on an end of the spring.

In accordance with a further feature of the invention, each of the yokes has two ends, each of the ends of each yoke being anchored to the bottom by one of the screws.

In accordance with an added feature of the invention, each of the ends of the spring are trapezoidal.

In accordance with a concomitant feature of the invention, the bottom is in the form of a tray with walls having blind tapped holes formed therein, the screws being inserted in the holes.

Other features which are considered as characteristic for the invention are set forth in the appended claims.

Although the invention is illustrated and described herein as embodied in a semiconductor component with several semiconductor elements, it is nevertheless not intended to be limited to the details shown, since various modifications and structural changes may be made therein without departing from the spirit of the invention and within the scope and range of equivalents of the claims.

Figure 2:
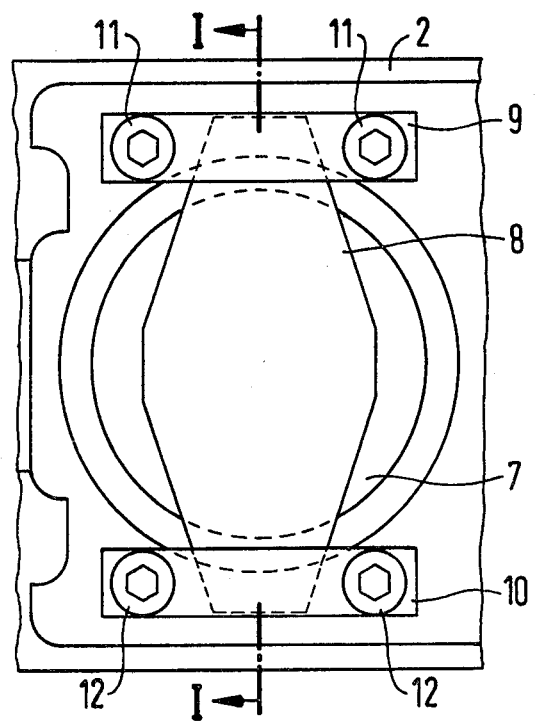

The construction and method of operation of the invention, however, together with additional objects and advantages thereof will be best understood from the following description of specific embodiments when read in connection with the accompanying drawings, in which:

FIG. 1 is a diagrammatic front elevational view partly in cross section through a semiconductor component, taken along the line I—I in the direction of the arrows; and FIG. 2 is a fragmentary top plan view taken onto the interior of a portion of the same semiconductor component.

Referring now particularly to FIGS. 1 and 2 of the drawing, it is seen that the semiconductor component has a metallic bottom 1 which is formed of aluminum or of copper, for instance. The bottom 1 may be constructed in the form of a tray and then provided with a wall 2. On the bottom 1 lies a disc 3 which is formed of electrically insulating, but highly thermally conducting material such as aluminum oxide or beryllium oxide. Lying on this disc 3 are, in sequence, the following parts: A first lead 4, two semiconductor elements 5,5' a second lead 6, and a pressure piece 7. A spring, such as a leaf spring 8 rests on the pressure piece 7. Yokes 9, 10 which are anchored by screws 11, 12 to the bottom 1 of the semiconductor component, lie on the ends of the leaf spring 8. The yokes are longer than the width of the leaf springs measured at their ends. It is therefore possible to hold the springs without the holes required for the screws. The screws can accordingly be disposed closer to the center of the semiconductor elements. Each of the screws, furthermore needs to take up only one-quarter of the contact pressure, so that the screw diameter can be made smaller than if only two screws were used, and the center line of the screw can accordingly be still closer to the semiconductor elements. Overall, this results in a considerable reduction of the lever arm and therefore a smaller bending moment is exerted on the bottom. The deformation of the bottom can therefore be smaller for the same dimensions. In addition, the arrangement is particularly space-saving.

The contact pressure is first set by means of a pressure device placed on the yokes 9, 10. Then, the screws are tightened until they stop at the yoke, and the pressure device is removed. The necessary contact pressure is thereby exactly fixed. Advantageously, the yokes 9, 10 are each provided with a knife edge 16, 17, so that the inclination of the tightened leaf spring is not transmitted to the screws. This further facilitates the setting of the precise contact pressure. It is advisable to make the leaf springs trapezoidal at their ends. In this way the yokes can be made short, so that their deformation need not be taken into consideration for all practical purposes. The trapezoidal leaf spring has the further advantage that it has a flatter characteristic than a rectangular leaf spring. The larger spring excursion available in this manner reduces the drop in the contact pressure which occurs in the course of time due to the unavoidable plastic deformation of the parts to be clamped.

The tray-shaped construction of the housing bottom 1 increases the section modulus of the bottom and makes it possible to anchor the screws in blind tapped holes 15 provided in the wall 2.

The semiconductor component is sealed by a cover 13 which is formed of plastic, for instance, and through which a contact electrode 14 is brought. The contact electrode 14 visible in FIG. 1 may be electrically connected either to the first lead 4 or to the second lead 6.

There are claimed:

1. Semiconductor component with a plurality of semiconductor elements disposed in a case having a metallic bottom being in heatconducting contact with the semiconductor elements, electrical leads, and a leaf spring having ends and providing electrical pressure contact between the semiconductor elements and the leads, comprising yokes each holding a respective end of the spring, and at least two screws anchoring said yokes and the semiconductor elements to the bottom.

2. Semiconductor component according to claim 1, wherein each of said yokes have a knife edge formed thereon resting on an end of the spring.

3. Semiconductor component according to claim 1 or 2, wherein each of said yokes has two ends, each of said ends of each yoke being anchored to the bottom by one of said screws.

4. Semiconductor component according to claim 1 or 2, wherein each of the ends of the spring are trapezoidal.

5. Semiconductor component according to claim 1 or 2, wherein said bottom is in the form of a tray with walls having blind tapped holes formed therein, said screws being inserted in said holes.

* * * * *